(12) United States Patent
Zoellick et al.

(10) Patent No.: US 6,281,673 B1
(45) Date of Patent: Aug. 28, 2001

(54) LOW ERROR, SWITCHABLE MEASUREMENT LEAD DETECT CIRCUIT

(75) Inventors: Raymond D. Zoellick, Bothell; Douglas A. Miller, Stevenson, both of WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 09/264,607

(22) Filed: Mar. 9, 1999

(51) Int. Cl.[7] .................................................... G01R 19/14

(52) U.S. Cl. ............................................................ 324/133

(58) Field of Search .................................... 324/133, 122; 340/568.4, 568.1, 635, 644, 653, 656

(56) References Cited

U.S. PATENT DOCUMENTS

| 5,416,470 | * | 5/1995 | Tanaka et al. | ........................ 324/133 |
| 5,867,056 | * | 2/1999 | Zoellick | ................................ 327/541 |

FOREIGN PATENT DOCUMENTS 05060799   12/1993   (JP) .

* cited by examiner

Primary Examiner—Safet Metjahic
Assistant Examiner—J Kerveros
(74) Attorney, Agent, or Firm—Christensen O'Connor Johnson Kindness PLLC

(57) ABSTRACT

A low error, switchable measurement lead detect circuit (9) for providing accurate current measurement readings and reducing susceptibility to false measurement lead detections due to leakage current is described. A gate (14) that receives an input select voltage $V_s$ selectively connects either a supply voltage, $V_d$, or ground to the input of a voltage divider (13). $V_d$ is connected during a measurement lead detection mode of operation or open fuse detection mode of operation, and a ground is connected during a current measurement mode of operation. During the measurement lead detection mode of operation, if the pin of a measurement lead is present in a split jack (12), the voltage divider (13) divides the supply voltage, $V_d$. Conversely, if no measurement lead pin is present in the split jack (12), the output voltage, $V_o$, of voltage divider (13) equals the level of $V_d$. During open fuse detection mode of operation, a measurement lead is present in the split jack (12), and if a fuse (F1) is present, the voltage divider divides the supply voltage, $V_d$. If a fuse (F1) is not present or is blown, the output voltage, $V_o$, of voltage divider (13) equals the level of $V_d$. During the current measurement mode of operation, the voltage divider (13) and shunt (11) form a series parallel circuit when a measurement lead pin is located in the split jack (12). The impedance of the shunt (11) is negligible in comparison to the impedance of the voltage divider (13), and the voltage drop across shunt (11) is proportional to the injected current. Because the voltage divider (13) is grounded through the gate (14) during the current measurement mode of operation, no error current from supply voltage, $V_d$, passes through the shunt (11). As a result, the accuracy of current measurement readings made during the current measurement mode of operation is improved. Because the supply voltage does not produce an error current during the measurement mode of operation, the overall impedance of the voltage divider (13) can be reduced to reduce susceptibility to leakage current during the measurement lead detection mode of operation.

17 Claims, 2 Drawing Sheets

LOW ERROR, SWITCHABLE MEASUREMENT LEAD DETECT CIRCUIT

FIELD OF THE INVENTION

This invention relates to electrical measuring instruments and, more particularly, to measurement lead detect circuits.

BACKGROUND OF THE INVENTION

Electrical measuring instruments, such as multimeters, employ measurement leads to couple the instrument to an electrical circuit or other item being tested. Measurement leads include connector pins on one side that are designed to be inserted into receptacles that form part of the electrical measuring instrument Usually, an electrical measuring instrument has multiple receptacles, with one set of receptacles used during a voltage measurement, and another set of receptacles used during a current measurement. During current measurement, the voltage across the current measurement set of receptacles is low. Because the impedance of the measurement circuitry connected to the current measurement receptacles is very low, applying a large voltage to the current measurement receptacles may result in a very high current flowing through the current measurement circuitry, and the electrical measuring instrument may be damaged or destroyed. Therefore, it is highly desirable for an instrument to warn a user that a measurement lead is installed in the current measurement input receptacle so the user does not mistakenly attempt to measure voltage when the measurement leads are inserted into the electrical current measurement receptacles This is usually accomplished by using a split jack receptacle and a measurement lead detect circuit. Additionally, an electrical meter equipped with measurement lead detection capability can warn a user of an improperly seated measurement lead or a blown overcurrent fuse.

A split jack receptacle includes a pair of spaced-apart electrical contacts. The insertion of a connector pin located at one end of a measurement lead into a split jack receptacle bridges the space between the contacts thereby creating an electrical connection between the contacts.

Measurement lead detect circuits commonly consist of a shunt circuit and a detection circuit separated by a split jack receptacle used for electrical current measurements. A common method of realizing a measurement lead detect circuit is to couple one contact of a split jack receptacle to ground through a low-value shunt resistor in series with an overcurrent fuse, and couple the other contact of the split jack receptacle to a supply voltage through two series connected high-value pull-up resistors. The voltage at the common node of the two high-value pull-up resistors is provided to detection circuitry located within the measuring instrument by connecting the common node to a high-input impedance device, such as an analog-to-digital converter or a comparator. The detection circuitry located within the measuring instrument is designed to indicate the presence of a measurement lead when the voltage at the common node of the two high-value pull-up resistors is less than the supply voltage, and indicate the absence of a measurement lead when the voltage at the common node of the two high-value pull-up resistors is equal to the supply voltage.

When a measurement lead pin is inserted into the split jack, the supply voltage is coupled to ground through the two high-value pull-up resistors in series with the low-value shunt resistor and overcurrent fuse, resulting in electrical current flow. Current flow through the two high-value pull-up resistors results in a voltage drop across the resistors. This voltage drop divides the supply voltage between the two high-value pull-up resistors. The resulting voltage at the common node of the two high-value pull-up resistors is therefore less than the supply voltage, which indicates the presence of a measurement lead in the split jack. Conversely, if no measurement lead is present, the supply voltage and the two high-value pull-up resistors are not coupled to ground, and there is no electrical current flow As a result, there is no voltage drop across the two high-value pull-up resistors. The voltage at the common node of the two high-value pull-up resistors is therefore equal to the supply voltage, indicating the absence of a measurement lead.

When a measurement lead is properly seated in the split jack, the electrical measuring instrument may be used to measure electrical current flow through an item being tested. The other end of the measurement lead is connected to the item being tested, and the electrical current is coupled through the lead to the electrical measuring instrument, through the overcurrent fuse and shunt resistor, and returns through a common measurement lead. Current injected into the electrical measuring instrument via the measurement lead by the item being tested is divided between the shunt and the voltage divider. Because the shunt impedance is several orders of magnitude less than the voltage divider impedance, nearly all injected current flows through the shunt. The current flowing through the shunt creates a proportional voltage across the shunt. This voltage is provided to high-input impedance measurement circuitry located within the measuring instrument, which outputs a measurement value proportional to the monitored shunt voltage.

This approach has several disadvantages. First, whenever a measurement lead is present, the supply voltage utilized for measurement lead detection is coupled to ground through the two high-value pull-up resistors in series with the low-value resistor shunt and overcurrent fuse, resulting in electrical current flow. This electrical current induces a voltage across the shunt that increases the voltage induced by the current injected into the electrical measuring instrument by the item being tested via the measurement lead, which results in measurement error. While this measurement error can be minimized by increasing the impedances of the high-value pull-up resistors, the error cannot be eliminated.

Second, even when a measurement lead is not present, leakage current flowing between the split jack electrical contacts may be sufficient to cause the lead detect circuit to indicate that a lead is present. In this regard, dirt and humidity can create a leakage path between the electrical contacts of the split jack. When this occurs, the supply voltage is coupled to ground through the series combination of the voltage divider, leakage path, overcurrent fuse, and shunt. In many circuits the effect of such a leakage path is negligible because the impedance of the leakage path is several orders of magnitude larger than any other impedance in the circuit, resulting in nearly all the voltage drop appearing across the leakage path. Unfortunately, this is not true when the impedances of the two high-value pull-up resistors are increased so as to minimize the error current when a measurement lead is present. In this case, the impedance of the leakage path between the split jack electrical contacts may have the same order of magnitude as the high-value pull-up resistors. Accordingly, the leakage current results in a much larger portion of the supply voltage appearing across the two high-value pull-up resistors. When this voltage drop is divided at the voltage divider output, the output voltage is reduced to a value below that of the supply voltage. Such a reduction may result in a false measurement lead detection. One way to reduce the possibility of false measurement lead detection due to leakage current is to reduce the values of the pull-up resistors. Unfortunately, this reduction proportionally increases the measurement error current when a measurement lead is present.

As will be readily appreciated from the foregoing discussion, there is a need for a new and improved measurement lead detect circuit that reduces or eliminates error due to the current induced by a supply voltage utilized during measurement lead detection and reduces the susceptibility to false measurement lead detections due to leakage current. The present invention is directed to fulfilling this need.

SUMMARY OF THE INVENTION

In accordance with this invention, a low error, switchable measurement lead detect circuit is provided for use in electrical measuring instruments. The switchable measurement lead detect circuit includes a shunt and a voltage divider separated by a split jack, and a gate device. The impedance of the voltage divider is preferably several orders of magnitude greater than the impedance of the shunt. The shunt couples one electrical contact of the split jack to ground. The voltage divider couples the other electrical contact of the split jack to the gate device. The gate device is used to switch between two modes of operation-measurement lead detection and current measurement.

In accordance with other aspects of this invention, during the measurement lead detection mode of operation, the gate device connects a supply voltage to the voltage divider. If no measurement lead is inserted into the split jack, the electrical contacts of the split jack are open and no current may flow through the voltage divider. Because no current flows through the voltage divider, there is no voltage drop across the voltage divider. As a result, there is no voltage division and the output voltage of the voltage divider equals the supply voltage, indicating the absence of a measurement lead. Conversely, when a measurement lead is installed into the split jack, the measurement lead pin bridges the gap between the electrical contacts of the split jack and the voltage supply is then coupled to ground through the series combination of the voltage divider and the shunt. Accordingly, an electrical current equal to the supply voltage divided by the sum of the impedances of the voltage divider and the shunt flows through the voltage divider and the shunt. This current induces a voltage drop across the voltage divider, and voltage division occurs As a result, the output voltage of the voltage divider is less than the supply voltage, indicating the presence of a measurement lead.

In accordance with yet other aspects of this invention, during the current measurement mode of operation, the gate device connects the voltage divider to ground, rather than to a supply voltage. When a measurement lead is inserted into the split jack, current from the item being tested is injected into the split jack via the measurement lead. The injected current flows to ground through parallel paths formed by the voltage divider and the shunt. Because the shunt impedance is several orders of magnitude smaller than the voltage divider impedance, nearly all the current flows through the shunt. Only a negligible amount of current flows through the voltage divider. The current flowing through the shunt creates a reference voltage that is directly proportional to the current flow. Because the supply voltage utilized during measurement lead detection is replaced by a ground potential during current measurement, the error current in the shunt induced by this supply voltage is eliminated.

In accordance with still other aspects of this invention, the voltage divider impedance is designed to be at least an order of magnitude less than leakage path impedance across the split jack. As a result, a larger portion of the voltage drop induced by leakage current occurs across the split jack than across the voltage divider during the measurement lead detection mode of operation. The lower voltage drop across the voltage divider results in the output voltage of the voltage divider being closer to the supply voltage than would be the case if the impedance of the voltage divider impedance was the same order of magnitude as the split jack leakage path impedance. Because a voltage divider output voltage equal to the supply voltage indicates the absence of a measurement lead, including a voltage divider whose impedance is designed to be at least an order of magnitude less than the leakage path impedance of the split jack makes the measurement lead detection circuitry less susceptible to false detections due to leakage current.

In accordance with even further aspects of this invention, an overcurrent fuse is interposed between the split jack receptacle and the shunt. The shunt in series with the overcurrent fuse couples one electrical contact of the split jack to ground. During the measurement lead detection mode of operation, an open fuse is detected when the measurement lead is inserted into the split jack. When a measurement lead is inserted into the split jack, the measurement lead pin bridges the gap between the electrical contacts of the split jack and the voltage supply is then coupled from the gate device to ground through the series combination of the voltage divider, the overcurrent fuse, and the shunt. If the overcurrent fuse is open, no electrical current will flow through the circuit. Therefore, there will be no voltage drop across the voltage divider. As a result, the output voltage of the voltage divider will equal the supply voltage, indicating an open overcurrent fuse.

As will be readily appreciated from the foregoing description, the invention provides a switchable measurement lead detect circuit that (i) eliminates errors created by current induced by a voltage supply used for measurement lead detection, (ii) reduces susceptibility to false lead detections due to leakage current through a split jack, and (iii) provides overcurrent fuse detection capability.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
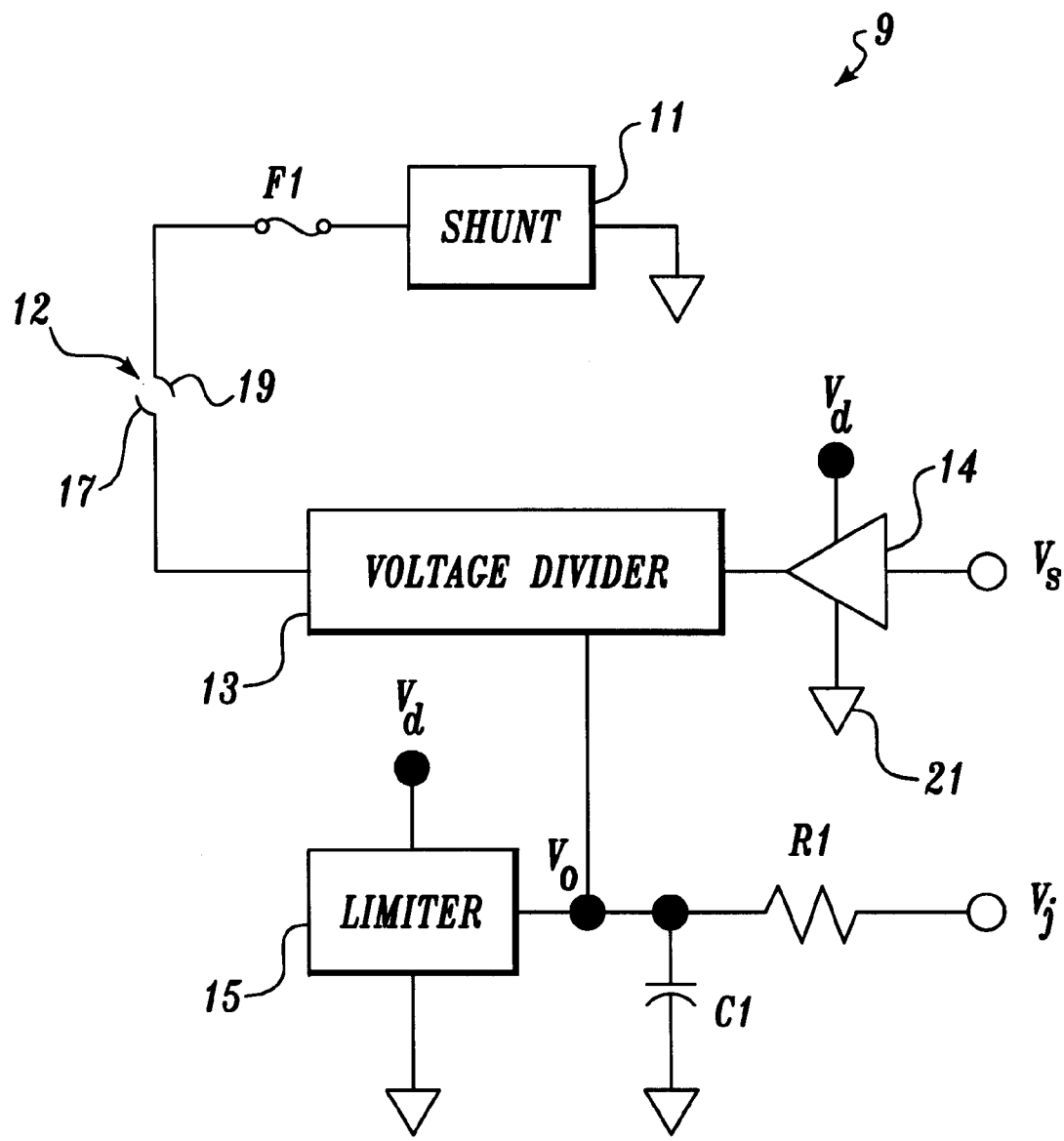
FIG. 1 is a block diagram of a low error, switchable measurement lead detect circuit formed in accordance with this invention.

FIG. 1 illustrates, in block form, a low error, switchable measurement lead detect circuit 9 formed in accordance with this invention. The low error, switchable measurement lead detect circuit 9 illustrated in FIG. 1 comprises: a shunt 1, a fuse F1, a split jack 12, a voltage divider 13, a CMOS gate 14, a limiter 15, an output resistor R1, and a filter capacitor C1.

A gate select signal, $V_s$, is applied to the input of the CMOS gate 14. Depending on the state of the gate signal, $V_s$, the CMOS gate 14 couples either a supply voltage, $V_d$, or ground 21 to the voltage divider 13. When the supply voltage, $V_d$, is coupled to the voltage divider 13, the low error, switchable measurement lead detect circuit 9 is in a measurement lead detection mode of operation. In the measurement lead detection mode of operation, the supply voltage, $V_d$, is coupled to one electrical contact 17 of the split jack 12 through the voltage divider 13. The other electrical contact 19 of the split jack 12 is connected to ground 21 through a series circuit formed by the fuse F1 and the shunt 11. When a measurement lead pin is inserted into the split jack 12, the measurement lead pin bridges the gap between the electrical contacts 17 and 19 of the split jack 12. Accordingly, the supply voltage, $V_d$, is coupled through the series circuit formed by the voltage divider 13, the split jack 12, the fuse F1, and the shunt 11, to ground. An electrical current flows through this series circuit when a measurement lead pin is inserted in the split jack. This current induces a voltage drop across the voltage divider 13, which produces an output voltage, $V_o$, whose magnitude is less than the supply voltage, $V_d$. Preferably, the impedance of voltage divider 13 is at least several orders of magnitude greater than the impedance of shunt 11. As a result, substantially all of the voltage drop across the series circuit formed by the voltage divider 13, the jumpered split jack 12, the fuse F1, and the shunt 11 occurs across the voltage divider 13. The voltage divider is structured such that the voltage divider output voltage, $V_o$, is significantly less than the supply voltage, $V_d$, when a measurement lead pin is inserted in the split jack, so that the difference between $V_o$ and $V_d$ can be detected.

If no measurement lead pin is present in the split jack 12, the electrical contacts of split jack 12 are open. Consequently, the supply voltage, $V_d$, is not connected to ground 21 via the voltage divider 13, the split jack 12, the fuse F1, and the shunt 11. As a result, except for leakage current, no electrical current flows from the supply voltage, $V_d$, to ground. Accordingly, the output voltage, $V_o$, is equal to the voltage supply level, $V_d$.

Additionally, when the switchable measurement lead detect circuit 9 is in lead detection mode, and a measurement lead pin is inserted into the split jack 12, the measurement lead detect circuit 9 may be used to check for an open overcurrent fuse F1. If overcurrent fuse F1 is present, an electrical current will flow through overcurrent fuse F1 to ground. As a result, the voltage divider output voltage, $V_o$, will be significantly less than the supply voltage, $V_d$. However, if the overcurrent fuse F1 is not present, or is blown, no electrical current will flow through overcurrent fuse F1 and the voltage divider output voltage, $V_o$, will be equal to the supply voltage, $V_d$.

In accordance with this invention, the impedance of voltage divider 13 is substantially less than the impedance of the leakage path through the split jack 12, preferably by several orders of magnitude. This impedance relationship is chosen to minimize false measurement lead detections due to leakage current. If, for example, the impedance of voltage divider 13 were equal to the impedance of the leakage path through split jack 12, the voltage drop across the leakage path would nearly equal the voltage drop across voltage divider 13. Accordingly, the output voltage, $V_o$, of the voltage divider 13 would be substantially less than the supply voltage, $V_d$, than would be the case if the voltage divider impedance was substantially less than the impedance of the leakage path through the split jack 12, thereby increasing the risk of a false measurement lead detection occurring. In contrast, minimizing the impedance of voltage divider 13 with respect to the impedance of the leakage path through the split jack 12 increases the proportional voltage drop across the leakage path, reducing the risk of a false measurement lead detection occurring.

Another consideration in choosing the impedance of voltage divider 13 is the power rating of the electrical measuring instrument. Voltage divider 13 must be able to dissipate power at the rated voltage of the electrical measuring instrument. Accordingly, as the impedance of voltage divider 13 is reduced, the physical size of voltage divider 13 must be increased to accommodate the larger current flow when the rated voltage is applied to the electrical measuring instrument. As a result, while the impedance relationship is primarily chosen to minimize false measurement lead detections due to leakage current, preferably it is also chosen so as not to require unnecessary space.

When the CMOS gate 14 connects the voltage divider 13 to ground 21, the low error, switchable measurement lead detect circuit 9 is in a current measurement mode of operation. In this mode of operation, when a measurement lead pin is inserted into the split jack 12, the measurement lead pin bridges the gap between the electrical contacts 17 and 19 of split jack 12. Current from the item being tested is injected through the measurement lead into the resulting parallel circuit formed by the fuse F1 and shunt 11 and by the voltage divider 13. Because the impedance of the shunt 11 is low (preferably negligible) compared to the impedance of voltage divider 13, nearly all of the injected current from the item being tested flows through shunt 11. Only a negligible amount of current flows through voltage divider 13. The magnitude of this voltage drop across the shunt 11 is directly proportional to the magnitude of the current flowing through shunt 11. Additionally, because the voltage divider 13 is connected to ground, no error current generated by the supply voltage $V_d$ flows through the shunt 11.

In the event of an overcurrent condition through split jack 12, fuse F1 provides circuit protection by removing the shunt 11 from the circuit. This opens the current path, which stops current flow through shunt 11. Preferably, the low error, switchable measurement lead detection circuit 9 also includes a limiter 15 that clamps the output voltage, $V_o$, of the voltage divider 13 between the supply voltage, $V_d$, and ground. As a result, any overvoltage at split jack 12 after fuse F1 has blown is dissipated in voltage divider 13. The output voltage, $V_o$, of voltage divider 13 is limited between the supply voltage, $V_d$, and ground, thereby protecting devices connected to the output of the voltage divider. Again, preferably, the impedance of voltage divider 13 should be chosen to handle the overvoltage condition and resulting power dissipation without requiring unnecessary physical space.

High-frequency noise on the output voltage, $V_o$, is rejected by a filter formed by the capacitor C1 and the voltage divider 13. The filter is a low-pass, single-pole RC filter, with a 3 dB cutoff frequency determined by the value of the filter capacitor C1 and the magnitude of the output impedance as seen from the output of the voltage divider 13. The single-pole filter attenuates noise for frequencies in excess of the filter cutoff frequency.

The thusly conditioned output voltage, $V_j$, is available at the output end of resistor R1, which is coupled to a high-impedance level detection or measurement circuit (not shown). The lead detection circuitry indicates the presence of a measurement lead when the conditional output voltage, $V_j$, is significantly less than supply voltage, $V_d$, and the absence of a measurement lead when the conditioned output voltage is substantially equal to the supply voltage, $V_d$. The output resistor R1 protects the measurement circuitry from transient signals on the output voltage, $V_o$, of voltage divider 13. Normally, the voltage drop across the output resistor R1 is negligible due to the negligible current drawn by the high input impedance circuitry connected to the output resistor R1. As a result, the conditioned output voltage, $V_j$, is substantially the same as the output voltage, $V_o$, of the voltage divider 13.

Figure 2:
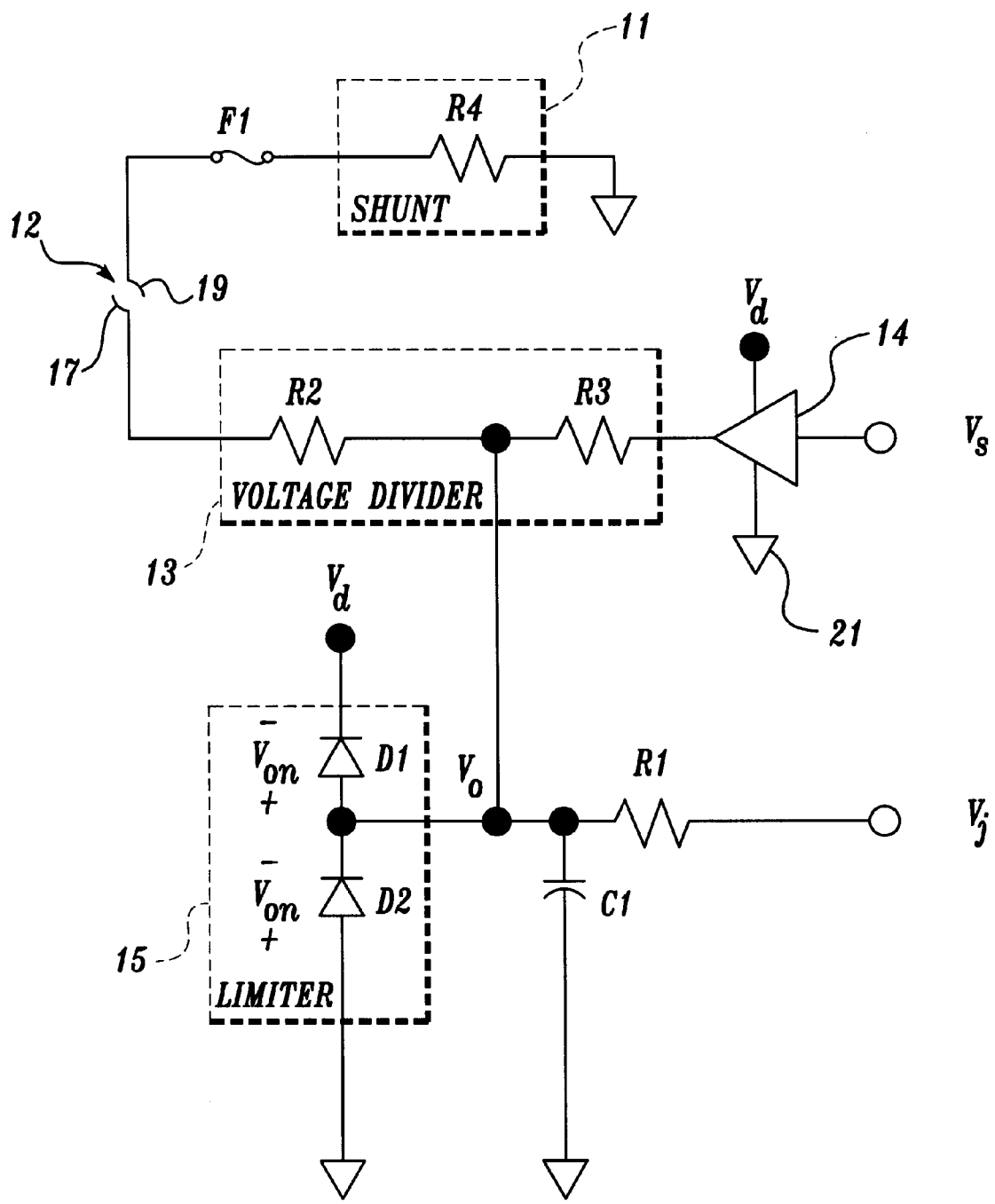
FIG. 2 is a schematic diagram of a shunt, voltage divider, and limiter suitable for use in the circuitry illustrated in block form in FIG. 1.

FIG. 2 is a more detailed schematic diagram of a low error, switchable measurement lead detect circuit 9 of the type illustrated in FIG. 1. More specifically, FIG. 2 illustrates the components presently preferred to form the shunt circuit 11, the voltage divider circuit 13, and the limiter circuit 15.

The shunt circuit 11 illustrated in FIG. 2 comprises: a resistor designated R4; the voltage divider 13 comprises two series connected resistors designated R2 and R3; and the limiter 15 comprises two diodes designated D1 and D2. The voltage divider output, $V_o$, occurs at the node common to R2 and R3. R2 and R3 are connected in series such that R3 is connected to the output of the CMOS gate 14 and R2 is connected to one of the contacts 17 of the split jack 12. As noted above, the impedance of R4 is much lower than the impedance of voltage divider 13. As a result, nearly all the electrical current injected by a measurement lead flows through R4. Only a negligible amount of current flows through R2 and R3 when the low error, switchable measurement lead detect circuit 9 is in the current measurement mode of operation.

When the low error, switchable measurement lead detect circuit 9 is in the measurement lead detection mode of operation, the presence of a measurement lead in the split jack 12 couples the gated supply voltage, $V_d$, to ground through the voltage divider resistors R2 and R3, split jack 12, fuse F1, and the shunt resistor R4. An electrical current substantially equal to the supply voltage, $V_d$, divided by the sum of the resistance values of R2, R3, and R4, flows through the series circuit. The output voltage, $V_o$, is therefore equal to the supply voltage, $V_d$, multiplied by the ratio of the sum of the resistance values of R2 and R4 divided by the sum of the resistance values of R2, R3, and R4.

As noted above, in order to minimize false measurement lead detections due to leakage current, values of R2 and R3 are chosen to be significantly less than the split jack leakage path resistance. In the absence of a measurement lead pin in the split jack 12, keeping the resistance values of R2 and R3 low when compared to the split jack leakage path resistance increases the voltage drop across the leakage path with respect to the voltage drop across R2 and R3. Choosing the resistance values of R2 and R3 such that the voltage drop across R2 and R3 is substantially lower than the voltage drop across the split jack leakage path resistance keeps the output voltage, $V_o$, close to the supply voltage, $V_d$, thereby reducing susceptibility to false measurement lead detections.

R2 also functions to limit current if an overvoltage condition occurs at the split jack 12 and fuse F1 has blown. Because the output voltage, $V_o$, is clamped between the supply voltage, $V_d$, and ground, any overvoltage at the split jack 12 is dissipated in R2. As a result, it is desirable for R2 to have a relatively high resistance value.

As noted above, when the low error, switchable measurement lead detect circuit 9 is in the current measurement mode of operation, CMOS gate 14 couples the voltage divider (specifically R3) to ground. As a result, supply voltage, $V_d$, is removed from the circuit and any error current induced by the supply voltage, $V_d$, is eliminated. When a measurement lead pin is present in the split jack 12, current from the item being tested is injected into the resulting parallel circuit formed by the shunt resistor, R4, and the voltage divider resistors, R2 and R3. The ratio of the current passing through the shunt resistor, R4, is equal to ratio of the sum of the resistances of R2 and R3 divided by the ratio of the sum of the resistances of R2, R3, and R4. Because the resistance of the shunt resistor, R4, is much less than the summed resistance of the voltage divider resistors, R2 and R3, nearly all current flows through the shunt resistor R4. A high input impedance measurement circuit (not shown) included in an electrical measuring instrument incorporating this invention measures the voltage caused by the current flow through the shunt resistor R4. The measuring circuitry converts the voltage value to a proportional current measurement value.

One of the diodes, D1, of the limiter circuit 15 forms a positive voltage clamp diode, and the other diode forms a ground clamp diode. In this regard, the cathode of D1 is connected to the supply voltage, $V_d$, and the anode of D2 is connected to ground. The cathode of D2 is connected to the anode of D1 and the junction between D1 and D2 is connected to the junction between R1, R2, and R3, and C1. Positive voltage clamp diode, D1, and the ground clamp diode, D2, clamp the voltage divider to either the supply voltage, $V_d$, or ground, respectively. If an overvoltage occurs at the output of the voltage divider 13 that exceeds the sum of the voltage supply, $V_d$, and the positive voltage clamp diode, D1, turn on voltage, $V_{on}$, D1 is forward biased and the voltage divider output is clamped to the sum of $V_d$ and $V_{on}$. Conversely, if the output of the voltage divider 13 is less than the negative value of $V_{on}$, the ground clamp diode, D2, is forward biased and the voltage divider output is clamped to the negative value of $V_{on}$.

While the presently preferred embodiment of the invention has been illustrated and described, it will be appreciated that various changes can be made therein without departing from the spirit and scope of the invention as set forth in the appended claims.

The embodiments of the invention in which an exclusive property or privilege is claimed are defined as follows:

1. A low error, switchable measurement lead detect circuit for detecting the presence of a measurement lead pin in a split jack formed of at least two contacts of an electrical measuring instrument, said low error, switchable measurement lead detect circuit comprising:

(a) a gate having a gate input for receiving a control signal and a gate output connected to either a supply voltage or ground, depending on the state of said control signal;

(b) a voltage divider connected between the output of said gate and one contact of a split jack formed of at least two contacts for dividing the output of said gate when said gate connects said gate output to said supply voltage and producing a divider output whose magnitude is less than said supply voltage; and (c) a shunt connected between ground and another contact of said split jack.

2. The low error, switchable measurement lead detect circuit claimed in claim 1 wherein the impedance of said voltage divider is less than the impedance of the leakage path through said split jack.

3. The low error, switchable measurement lead detect circuit claimed in claim 2 wherein the impedance of said shunt is less than the impedance of said voltage divider.

4. The low error, switchable measurement lead detect circuit claimed in claim 1 wherein the impedance of said shunt is less than the impedance of said voltage divider.

5. The low error, switchable measurement lead detect circuit as claimed in claim 1 wherein said voltage divider comprises a pair of series connected resistors.

6. The low error, switchable measurement lead detect circuit as claimed in claim 5 wherein the resistance of said pair of series connected resistors forming said voltage divider is less than the resistance of the leakage path through said split jack.

7. The low error, switchable measurement lead detect circuit as claimed in claim 5 wherein said shunt comprises a resistor.

8. The low error, switchable measurement lead detect circuit as claimed in claim 7 wherein the resistance of said resistor forming said shunt is less than said pair of series connected resistors forming said voltage divider.

9. The low error, switchable measurement lead detect circuit as claimed in claim 8 wherein the resistance of said pair of series connected resistors forming said voltage divider is less than the resistance of the leakage path through said split jack.

10. The low error, switchable measurement lead detect circuit claimed in claim 1, including a fuse connected between said shunt and said split jack.

11. The low error, switchable measurement lead detect circuit claimed in claim 1, including a limiter for limiting the magnitude of said divider output voltage.

12. The low error, switchable measurement lead detect circuit claimed in claim 11, wherein said limiter includes a pair of diodes.

13. The low error, switchable measure lead circuit claimed in claim 12 wherein one of said diodes is connected between said divider output and a positive voltage supply, said diode being reverse biased when the magnitude of the voltage of said divider output is less than the magnitude of said positive voltage supply; and wherein the other of said diodes is connected between said divider output and ground, said other diode being reverse biased when said divider output is greater than a ground potential.

14. The low error, switchable measurement lead detect circuit claimed in claim 1, wherein said gate is a CMOS gate.

15. The low error, switchable measurement lead detect circuit claimed in claim 1, including a filter capacitor connected between ground and said divider output.

16. The low error, switchable measurement lead detect circuit claimed in claim 1, including one end of an input resistor connected to said divider output.

17. The low error, switchable measurement lead detect circuit claimed in claim 16, including a filter capacitor connected between ground and said divider output.

* * * * *